(12) United States Patent
Swerlein et al.

(10) Patent No.: US 7,176,819 B1
(45) Date of Patent: Feb. 13, 2007

(54) PRECISION LOW NOISE-DELTA-SIGMA ADC WITH AC FEED FORWARD AND MERGED COARSE AND FINE RESULTS

(75) Inventors: Ronald L Swerlein, Longmont, CO (US); Brian Stewart, South Burlington, VT (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/221,620

(22) Filed: Sep. 8, 2005

(51) Int. Cl.
*H03M 3/00* (2006.01)
(52) U.S. Cl. .................. 341/143; 341/155; 341/156
(58) Field of Classification Search ............... 341/143, 341/155, 118, 156, 131, 139
See application file for complete search history.

(56) References Cited

U.S. PATENT DOCUMENTS

| | | | | |
|---|---|---|---|---|
| 5,206,647 A | * | 4/1993 | Stone | 341/139 |
| 5,311,181 A | * | 5/1994 | Ferguson et al. | 341/143 |
| 6,166,668 A | * | 12/2000 | Bautista et al. | 341/118 |
| 6,198,417 B1 | * | 3/2001 | Paul | 341/143 |
| 6,271,782 B1 | * | 8/2001 | Steensgaard-Madsen | 341/143 |
| 6,370,190 B1 | * | 4/2002 | Young et al. | 375/233 |
| 6,556,158 B2 | * | 4/2003 | Steensgaard-Madsen | 341/131 |
| 6,876,241 B2 | * | 4/2005 | Coley et al. | 327/291 |

* cited by examiner

*Primary Examiner*—Jean Bruner Jeanglaude
(74) *Attorney, Agent, or Firm*—Edward L. Miller

(57) ABSTRACT

A delta-sigma converter has coarse and fine ADCs, wherein an integrated error signal is coupled to the coarse ADC whose output drives a DAC to create feedback that achieves loop balance. The coarse ADC provides the most significant bits of the result. The integrated error signal is also applied to a fine ADC whose output bits are not incorporated into the feedback, but which are combined with those of the coarse ADC and the combination applied to a filter that averages the hunting that represents loop balance. A DC feed forward circuit shunts the integrator with a replica of the applied input signal to apply it to the coarse ADC through a summer, allowing its output to be just the integrated error signal without including the applied input. If continuous integration is used, an AC feed forward circuit provides a compensatory voltage that is removed from the integrator output (or alternatively, is added to its input) and that corrects for a frequency dependent error.

20 Claims, 4 Drawing Sheets

PRECISION DELTA-SIGMA MODULATOR
WITH MERGED COARSE & FINE RESULTS

*BASIC DELTA-SIGMA ARCHITECTURE*

BASIC DELTA-SIGMA ARCHITECTURE
WITH DC FEED FORWARD

PRECISION LOW NOISE-DELTA-SIGMA ADC WITH AC FEED FORWARD AND MERGED COARSE AND FINE RESULTS

REFERENCE TO ISSUED PATENT

The subject matter of U.S. Pat. No. 6,876,241 B2 issued 5 Apr. 2005 and entitled CIRCUIT FOR GENERATING FROM LOW VOLTAGE EDGES HIGHER PULSES HAVING PRECISE AMPLITUDES AND DURATIONS, filed 31 Jul. 2003 by William H. Coley and Stephen B. Venzke and assigned to Agilent Technologies, Inc., is of interest to the subject matter disclosed herein. In particular, it pertains to a preferred way of implementing the Feedback DAC for the delta-sigma architecture described in this application. For this reason, and for the sake of brevity, CIRCUIT FOR GENERATING FROM LOW VOLTAGE EDGES HIGHER PULSES HAVING PRECISE AMPLITUDES AND DURATIONS is hereby expressly incorporated herein by reference.

BACKGROUND OF THE INVENTION

The basic delta-sigma architecture is one where an analog input value is summed with a feedback value (which is often implemented as a voltage) to produce an error difference that is integrated and subsequently quantized into discrete values by an ADC (Analog to Digital Converter). A DAC (Digital to Analog Converter) driven by the ADC produces the feedback value. When the feedback value equals the input value the integrator output stops ramping, but typically hunts on either side of the true point of loop balance, owing to finite resolution of the ADC-DAC combination (i.e., the feedback value is quantized, but the input value is not, so exact cancellation is unlikely). Typically, the ADC and the DAC operate at the same rate, and that rate corresponds to a bandwidth that is much higher than a limited bandwidth with which the applied input is allowed to vary. A digital filter is responsive to the sequence of quantized values from the ADC; the digital filtering averages out the hunting to produce a result that corresponds (perhaps after some brief delay needed for the loop to balance, or nearly so) to a recent value of the bandwidth limited input. If desired, the ADC values may be further processed to produce a digital output that represents another measure of the applied analog input value (e.g., its Root Mean Squared value).

The basic delta-sigma architecture just described is well known, and that basic architecture and variants thereof have been used in a variety of different applications, as described in the literature. See, in particular, OVERSAMPLING DELTA-SIGMA DATA CONVERTERS Theory, Design and Simulation, edited by Steven R. Norsworthy, Richard Schreier and Gabor C. Temes, published in 1997 by the IEEE Press (ISBN 0-7803-1045-4).

There have been a number of improvements or extensions of the basic delta-sigma technique over the years since a delta modulator was first proposed in 1954 by C. C. Cutler (see U.S. Pat. No. 2,927,962) and a sigma improvement thereto was proposed in 1962 by Inose, Yasuda and Murakami. Among these are various way to incorporate, by nesting or by cascading, one instance of the architecture with another ('higher order loops') with the goal of improved performance.

At present, the delta-sigma architecture is the highest accuracy architecture known for an ADC. Other ADC architectures can run faster, but the delta-sigma architecture has accuracy and linearity that depend chiefly on just the DAC. This can be appreciated if one considers that it is the difference between the actual input and the replica thereof produced by the DAC that is the origin of the feedback that drives the loop to balance (where 'balance' includes the notion of continuous hunting that 'balances over time' about the correct answer). Any non-linearity in the ADC, or offset or non-linearity in the integrator is construed by the loop as just further error to be nulled out through hunting. We may thus think of the hunting as having a component that corresponds to quantization issues arising from finite resolution in the ADC and the DAC, and other components that appear in whatever degree is needed to get the loop to balance (through hunting). Almost by definition, when the loop is thus balanced, the digital input to the DAC has GOT to represent the input to the degree we can detect error in the difference between the actual input and the feedback. That is why the integrator is such a powerful actor in the delta-sigma architecture: over time even very small errors (think: degrees of imbalance) are accumulated into actionable quantities that drive the hunting process and null themselves out.

Now, we believe that the DAC described in the incorporated '241 B2 Patent is at present, anyway, about as good as they come for use in a delta-sigma converter. It is a pulse width/duty cycle affair designed to exhibit very stable transition times and large voltage swings. In this application we seek ways to operate a delta-sigma ADC with the best linearity and the greatest precision obtainable in a commercially produced DVM (Digital Volt Meter). We are also mindful that many of the 'higher order loops' described in the literature have stability problems (say, for example, under certain conditions the hunting behavior becomes a willful and independent 'self-winding oscillator' rather than a mechanism that tracks the input and nulls out errors).

In many respects the delta-sigma architecture resembles a sampled control loop, and the needed integration can be provided by either a discrete (sampled) or continuous integrator mechanism. Some instances of the delta-sigma conversion technique intended for consumer or other high volume/low cost applications have applied the techniques of Integrated Circuit (IC) design to produce an entire delta-sigma converter within a single chip. As a part of these efforts a continuous integrator is often avoided in favor of a switched capacitor integration technique that produces an output based solely on samples taken at the discrete points in time when the DAC and ADC make their decisions as to what their outputs are to be. (For steady state DC inputs the switched capacitor integrator produces what the output of an actual continuous integrator would be if it were used instead.) And, since a switched capacitor integrator uses sampling techniques to enforce the notion of discrete points in time, an AC input is automatically quantized into a series of discrete steps (any change in the AC input during the interim between loop decisions is simply not seen and is ignored). However, such switched capacitor integration techniques are subject to various error mechanisms that limit the precision of the delta-sigma converters of which they are a part, even for DC inputs. At present, a delta-sigma ADC of the highest precision must use an actual continuous time (think genuine analog) integrator.

Furthermore, if the loop decision time for the feedback in the delta-sigma architecture is short, say on the order of a microsecond, then we are tempted to use the delta-sigma technique to generate a sequence of digital values that represent an AC signal having a bandwidth of up to 100 KHz, or so. Unfortunately, the genuine analog integrator needed to obtain high precision for DC creates a frequency related error (in the integrated loop error signal) that increases as frequency gets higher, and degrades loop performance. Thus, the use of a continuous integrator with an AC input is another area of delta-sigma behavior that is susceptible of improvement.

It turns out that using an actual continuous integrator performs 'extra' integration for AC signals that adds an additional component to the hunting. (It is 'extra' only in the sense that the AC input continues to change in the interim between loop decision cycles for quantization and feedback adjustment, and the continuous integrator sees that movement and incorporates it into the integrated result.) In one sense these additional movements in the error signal constitute unwanted components that adversely affect the output (they arise, as far as a quantized view of the loop's universe is concerned, 'out of nowhere').

It would be desirable if there were a way to eliminate the error related to input frequency produced in a delta-sigma converter that is otherwise precision and that uses a continuous time genuine analog integrator.

SUMMARY OF THE INVENTION

A delta-sigma converter achieves stable high speed precision results by incorporating a DAC of suitably high precision and a coarse/fine architecture for two ADCs, wherein an integrated error signal is coupled to a coarse ADC whose multi-bit output drives the DAC to create the feedback that achieves loop balance. The coarse ADC also provides the most significant digits (bits) of the result. The integrated error signal is also applied to a fine ADC whose output bits are not incorporated into the feedback, but which are combined with those of the coarse ADC. The combined bits of the coarse and fine ADCs are processed and applied to a filter that averages the hunting that represents loop balance. The result is to significantly increase the resolution with which the converter operates, and which allows a variable speed-resolution selection ahead of the filtering. The overall linearity is essentially dependent solely upon that of the DAC. ADC feed forward circuit shunts the integrator with a replica of the applied input signal to apply it to the coarse ADC through a summer. Since the feedback driven hunting forces the error signal to average to zero for any static input, the integrator output is freed to be just the integrated error signal without including an integration of the applied input, reducing the need for dynamic range of the fine ADC. An AC feed forward circuit provides a compensatory voltage that is removed from the integrator output (or alternatively, is added to its input) and that corrects for the frequency related error that appears at the output of the integrator if a continuous time genuine analog integration mechanism is used. The technique uses a minimum of components and is compatible with the use of discrete integration techniques, such as switched capacitor, and also with single bit feedback used in place of the preferred multi-bit feedback.

DESCRIPTION OF A PREFERRED EMBODIMENT

Figure 1:
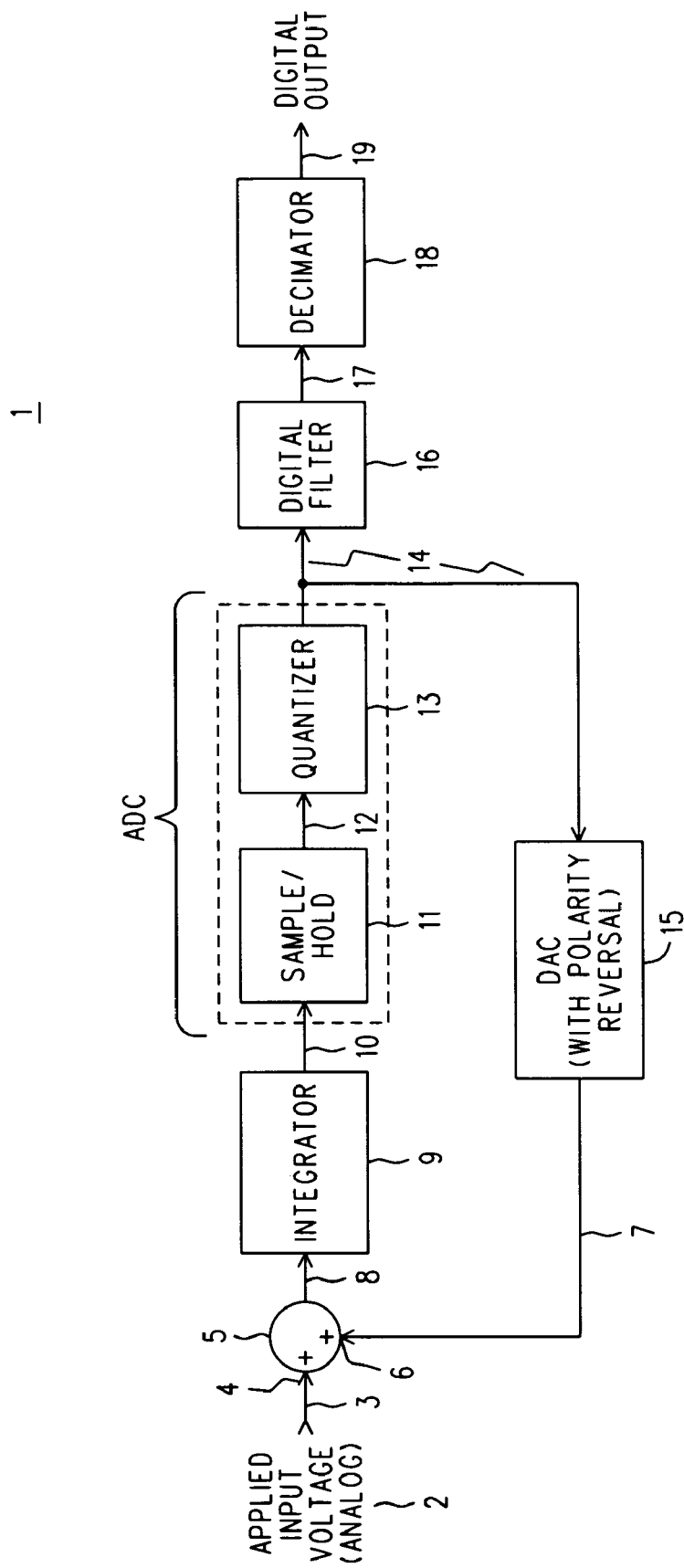
FIG. 1 is a simplified block diagram of a prior art delta-sigma ADC.

Refer now to FIG. 1, wherein is shown a simplified block diagram 1 of an early prior art delta-sigma arrangement for performing analog to digital conversion. An input voltage 2 is applied to an input conductor 3, from whence it is coupled to a first + (plus) input 4 of an analog voltage summing circuit 5. The input voltage applied to conductor 3 may be subjected to previous suitable signal conditioning (not shown) before it reaches the first + input 4, the purpose of which signal conditioning might be to attenuate the input by a known amount, limit dv/dt, or limit voltage excursions by clipping them when they exceed a certain magnitude, etc.

Also applied to the voltage summing circuit 5 at a second + terminal 6 is a feedback voltage 7, that approximates to a greater or lesser degree an opposite polarity replica of the applied input signal 2. Thus, the output 8 of the voltage summing circuit 5 is an error signal (difference) indicative of the manner in which the feedback voltage 7 fails to actually be a replica of the applied input signal 2.

In the basic architecture of FIG. 1 the error signal 8 is integrated by an integrator 9 whose output 10 is digitized (11, 12, 13) for later processing (16, 17, 18) to become the desired digital output (19), with that same digitized integrator output 14 also being turned back into the analog feedback voltage 7 by a feedback DAC 15. (The digital output 14 from the ADC is complemented inside the DAC 15 to reverse its polarity before it is converted to an analog voltage.) The use of an integrator has certain consequences, an appreciation of which becomes a useful starting point for what is to come. The main one is that the integrator's output serves as a cumulative memory of the history of the state of the loop (that is, it accumulates the ongoing error to allow balance through hunting). If the digitized output 14 should produce from the feedback DAC a feedback voltage 7 that has no error signal 8 the integrator's output 10 will stop changing: the loop will have converged exactly, and will (ideally) remain that way until there is a change in the input. Of course, that happy situation seldom, if ever, occurs, as various conditions would have to obtain first: the applied input 2 might need to be static to comport with the discrete time nature of the ADC and the DAC (or at least not change except at loop decision times), and the applied input would need to be a value that the DAC could create exactly and thus produce a error signal of zero.

The predominant and typical manner of operation is for the error signal 8 to be non-zero by a small amount, one way or the other. Say it is a little too low for a while, but that an increase in the output 14 of the ADC would create an error larger than the present error. The continued error signal is accumulated by the integrator 9 into an ever larger change in its output 10, so that eventually a change in the ADC is produced. That change is reflected by the DAC 15, and in turn also by the error signal 8, which is now off by some amount in the other direction. The integrator begins to ramp its output in the other direction until there is another reversal in the polarity of the error signal, and the same thing happens again. The loop is hunting. This is not bad, and we are certain that, all things behaving correctly and given a steady input, the average value of the error signal 8 is zero (else the integrator would 'see' the persistent error and integrate it into an actionable amount having corresponding feedback). From this notion that the average of the error signal is zero we can draw certain conclusions. Chief among these is that if the DAC is nearly ideal, then the average of the ADC's output MUST represent the input (because the DAC's output 'is' thus the ADC's output). Another conclusion is that any non-linearities in the DAC are concealed by automatic adjustments in the hunting needed to produce balance (again, in the sense of average over time).

The non-convergence of a delta-sigma loop might be thought reminiscent of the repeating and non-terminating decimal fractions that occur in long division. If we were to tell you that we have this string of numbers 1428571428571 . . . you could, after some deliberation, state with certainty that this represents some variation on the ratio of one to seven. As we will see shortly, this comparison of delta-sigma to non-terminating decimal fractions, while initially tempting, is incorrect. To pursue this example, the output of the loop might actually be more like: 1/7, 1/8, 1/7, 1/9, . . . , etc.

It is now possible to better appreciate the function of the digital filter 16. Its output is the "average" value spoken of above, and its purpose is to suppress the hunting (which is a sequence of values) and replace it with single value. Now recall that we said that the cycle time of loop operation might be many times faster that the fastest dv/dt that we are prepared to apply as an input voltage 2. Say, the ADC and the DAC produce new outputs every microsecond. Then the filter 16 might be able to adequately reconstruct (in digital form, to be sure) at its output 17 even a one hundred kilohertz input signal. In the event that the applied input voltage is known to be slower, and that using mechanisms further downstream don't want or need a representation of such fast signals, a decimator 18 can produce a slower data rate at its output 19. This arrangement also allows an adjustable trade-off between the rate at which completed measurements are available and their resolution.

Indeed, the amount of averaging and the decimation factor may be varied depending upon the application, or for a configuration within an application. Increasing the degree of averaging reduces measurement noise. This allows the trade-off between input signal bandwidth and resolution. When the degree of averaging is high the decimation factor is usually increased to match the desired measurement bandwidth and the reading (measurement) rate. This is what allows the trade-off between measurement speed and resolution. This mechanism is well known, and the ratio of the ADC's sampling rate to the decimated sample rate is called the oversampling factor.

It is typical of conventional conversions loops constructed after the manner of FIG. 1 to use a single-bit comparator as the ADC and a comparably simple single-bit DAC, while operating the loop at very high rates. Its operation produces a sequence of bits (say, with each bit representing either plus and minus full scale) that is interpreted by a filter that produces the average of the last n-many bits. The filter typically has a 'shape' so that, for example, more weight is given to bits in the middle of the n-many. It will be noted that the loop of FIG. 1 will, unless it converges exactly (fat chance!), produce an error signal 8 that changes at the loop decision rate. The changes are steps in an ongoing variation (the hunting). It is these ongoing variations built of step changes at the loop decision rate that are integrated, measured by the ADC (11, 13), and then 'removed' from the ADC's output 14 by the filter 16.

Before proceeding, it is useful to further consider some topics related to the digital filter 16 and the nature of the values that it is to filter. As part of this exploration, it is useful to let the ADC (11, 13) be a multi-bit ADC, of say, six or eight bits (amounts that are quite realizable and whose use is practical). Let's begin by identifying the overall paradigm for the filtering. For the benefit of those who may have but a passing acquaintance with delta-sigma, it is helpful to identify the actual paradigm that is used and dismiss another one that is not.

In either case the n-many bits from the ADC are treated as individual symbols identifying ordinal values in value space of $2^n$ symbols. So, if the ADC were of four bits, we would not hesitate to identify those symbols as the familiar hexadecimal digits 0, 1, 2, . . . , 9, a, b, c, d, e and f. In the common case of a single bit the two digits are just the binary one (1) and zero (0). In the eight-bit case the value space is two hundred fifty-six symbols in size, and we don't have a list of handy names (or digit symbols) for the individual 256 different member of the collection, nor even a recognized conventional name for the collection (the algebra people would say it is the Integers modulo $2^8$, or I mod 256), and so we settle for grouping the eight bits together (each as a fused quantity, as it were) and treating each such grouping as a composite symbol that is 'eight things long.' We pay no attention to the 'things' (the binary meaning bits themselves) except as a means to represent the symbol, and in any case, we never simply concatenate the various bits into one long string and say it is a long binary number.

To continue then, one might think that conversion begins and that the symbols produced have a beginning that controls how the symbols relate to one another. In the earlier example of the non-terminating decimal fraction for 1/7 you would need to know that first digit in the string 142857142 . . . was weighted as one at 1/10, the second digit as four at 1/100, and so on. The implication is that both a delta-sigma measurement cycle and a filtering operation have a beginning and a duration, after which they both start over, and that 'filtering' amounts to the particular weighted summation indicated. Dismiss this idea, as the delta-sigma conversion loop has no such beginning, other than an initial start-up. Once it is started, it simply runs indefinitely. The filtering can be connected to the output at any time after that, and will produce a valid result after a sufficient number of symbols have been filtered; there is no first symbol, nor any permanent positional importance associated with a symbol.

Accordingly, the correct paradigm is this. The loop runs continuously, producing an indefinitely long sequence of symbols. The filter has an aperture of the last q-many symbols, and produces an average using a weighted summation of the last q-many symbols that have been applied to the filter. Each time a new symbol is applied, the oldest one is dropped, and different q-many symbols is contained with the filter. It produces a new average from this new combination of symbols: (once the pipe if filled) one new symbol in, one new average out. And don't forget that it is often the case that the central, or middle, symbols in the sequence of q-many thereof are given greater weight in the making of the average than are those at the beginning and end of the sequence.

For clarity, we can briefly return one last time to the 1/7 example. If a four bit ADC were in use for a symmetrical plus or minus input, then how might the pesky +(1/7) of full scale result be represented? Well, the four bits encode sixteen different symbols, whose meanings could be ±0/8, ±1/8, ±2/8, ±3/8, . . . ±7/8 parts of full scale. We could name the sixteen symbols a, b, c, d, e, f, g, h, and −a, −b, −c, −d, −e, −f, −g and −h, or we could use as names the ±0 through ±7 used in the numerators, so long as we don't get confused. And no matter how we pronounce their names, within the innards of an operating delta-sigma-filter system we almost certainly would use either a two's complement representation (which is preferred) or a sign magnitude representation (S000, S001, S010, . . . , S111 where S represents a sign bit)

for the four-bit groups. So, one answer for the question of representing +1/7 is the sequence b, c, b, b, c, a, d, b, c, . . . . Using uniform weighting, those nine symbols average to 0.138888 . . . , which is 0.004 below the desired value of 0.1428571 . . . . A longer sequence would allow a better approximation, even if the input (the target 1/7) were ('slowly') changing during the feedback controlled approximation process.

Next, we briefly touch on a topic that is near and dear to the designers of delta-sigma circuits: noise shaping, and how it affects the filter. This will require us to adopt a somewhat specialized notion of 'noise' as it is customarily used in connection with delta-sigma circuits.

To begin, we note that the basic rules of delta-sigma operation seem quite deterministic (almost computational in nature). We also acknowledge that, in the ideal and abstract, it is reasonable to assert that a computer program (or perhaps some other model) could, given a sufficiently detailed description of a particular delta-sigma circuit, predict with certainty the sequence of symbols that the loop will produce for any given set of initial conditions. The reality, however, is considerably different.

Despite the fact that delta-sigma is often analyzed as if it were truly a linear system, in actual fact it contains discontinuities (which appear to be output non-linearities with respect to an input) that are inherent in the quantizing. These allow slight amounts of 'real' thermally induced random behavior or quantum-like random behavior, both of which are inescapably present, to produce unpredictable internal signal fluctuations that stimulate the 'sensitivity to initial conditions' behavior that is associated with chaotic behavior in non-linear systems. We might say that delta-sigma is largely linear, but with some distributed discrete non-linearities. So, it is as if there were an evil demon in the loop with a random noise sprayer, and after some number of decision cycles the long term deterministic predictability vanishes, and no degree of finite precision, and no amount of finite additional detail about gains, thresholds and delays incorporated into the model will allow it to accurately predict behavior for the actual circuit after, say, fifty or one hundred decision cycles. Short term predictability remains possible, as is the characterization of overall behavior with statistical methods.

Given that this is the case, the usual method of analyzing delta-sigma behavior is to say that the behavior of the symbols created by the loop is separable into two classes. One class is the fundamental loop response that occurs as a result of tracking a changing input, and another is the hunting that is present even when the input is entirely steady and unchanging. Right away we can see that a desirable property of the filter is that it suppress (average out) the hunting without unduly affecting the ability of the filtered loop output to track a changing input. We should like to discover that the hunting is a high frequency behavior that is well away (on the frequency axis) from the highest frequency of applied input that we expect the loop to faithfully track. To some extent this can be arranged by making the loop operate with a decision time that is relatively short with respect to the shortest period that the applied input is allowed to exhibit.

But there is more to it than just that. Recall the example we gave above for symbols that averaged to 1/7. For any given implementation, there is an expected sequence length that is needed for the hunting to be averaged to a desired resolution. It is that sequence length which the filter must operate on and remove. The architecture that is discussed in this Specification is of the 'first order,' and it has been shown that for first order loops each doubling of the oversampling factor produces a one and one-half bit reduction in the hunting-related noise.

With all of this in mind, the usual analysis is to characterize the hunting as genuine random noise, and then ask what things might be done to the architecture of the loop to shift it to a higher frequency location in the spectrum. Thus arises the term 'noise shaping' as it applies to delta-sigma. It turns out that there is something that can be done.

Figure 2:
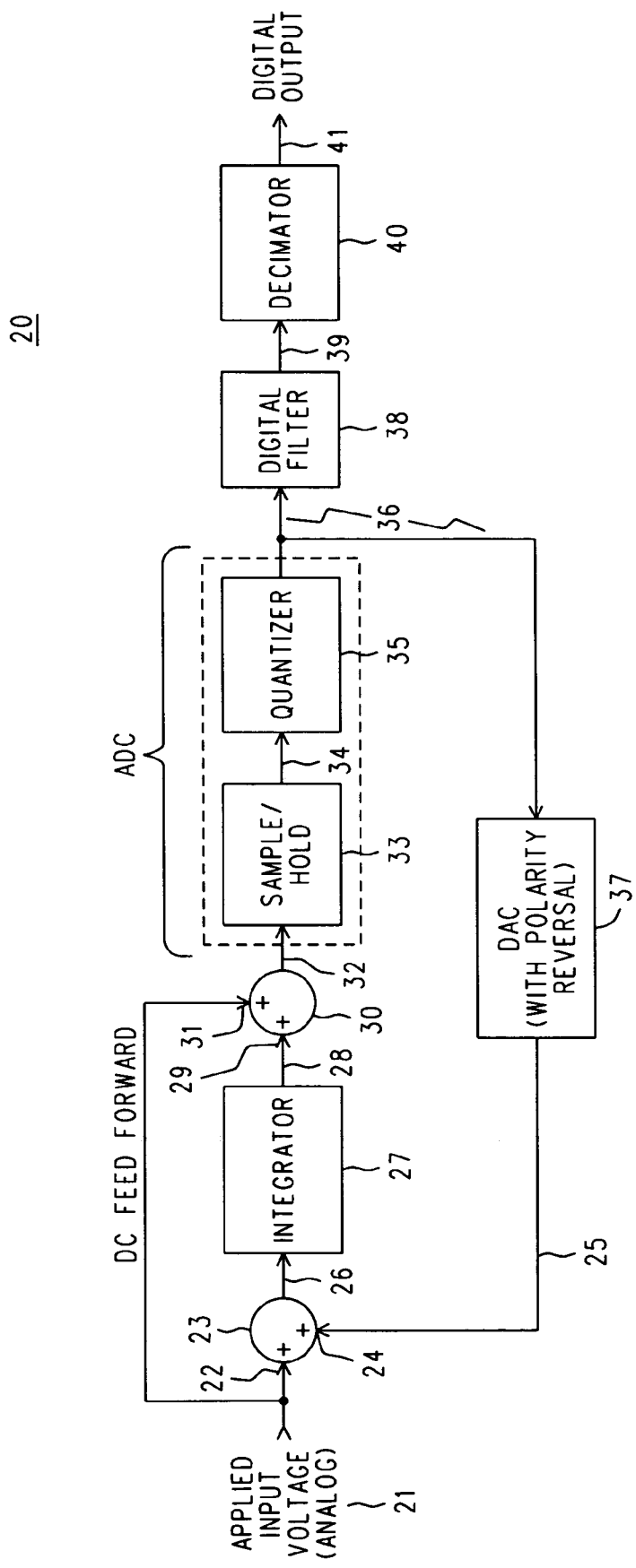
FIG. 2 is a simplified block diagram of a prior art delta-sigma ADC that incorporates feed-forward.

Now consider the improved architecture 20 shown in FIG. 2. It is also conventional, but the improvement is an interesting one. As before, an applied input voltage 21 appears at a first + (plus) input 22 of an analog voltage summing circuit 23. Also as before, a second + input 24 receives a (previously polarity inverted) feedback voltage 25 that represents the (unfiltered) output supplied by the overall loop. Also as before, the (raw) loop output (36) is that of an ADC (33, 34, 35) which is applied to: (A) a feedback DAC 37 whose output 25 is applied to a second + input 24 of the voltage summing circuit to produce an error signal 26; and, (B) a filter 38 whose output 39 may be downsampled by decimator 40 to produce a digital output 41.

In FIG. 2, however, the actual input 21 is also applied to one + (plus) input 31 of a voltage summer 30 whose other + input 29 is the output 28 of the integrator 27, and whose output 32 is the input to the ADC (33, 34, 35). The effect of this is to apply the input voltage 21 directly to the ADC. As before the integrator is driven by an error signal 26, but now that error signal 26 represents only the error by which the loop cannot exactly quantize the input, and does not include errors caused by waiting for the integrator to track changes in the applied input voltage 21. That is, perhaps (in true binary fashion) a single bit ADC and DAC can represent only ±1 (times zero-to-plus full scale), and even a multi-bit ADC and DAC can exactly represent only symbols corresponding to discrete ± binary fractional-of-full-scale values. However, none of these can exactly form 1/7 using a single symbol, and the loop must hunt to achieve balance. (Of course, 1/7 is just one example out of many, and we appreciate that the loop probably never balances exactly, no matter what, even for 'nice' values such as ½. The point is, that are many input values for which continuous hunting is, in principle, absolutely necessary.) Such a quantization error will appear in the error signal 26, and will, as a result of the lack of exactitude, result in the hunting behavior which has been previously described. The (different) error associated with a sudden step in the applied input voltage that would otherwise be attributable to finite loop response as the integrator 27 output ramped as needed to null the error (requiring about three loop decision cycles) is nearly eliminated by the (DC) feed forward 42 that is the duplicate of input 22 that is applied to + input 31 of summer 30.

Here are some things to notice about the architecture of the block diagram 20 in FIG. 2. First, unlike the integrator output 10 in FIG. 1, where that output matches the entire range of the input voltage, the integrator output 28 of FIG. 2 (assuming it is the same integration circuit as in FIG. 1) will range over only an amount corresponding to a step between adjacent levels of quantization by the DAC. Second, an analysis of the loop's transfer function shows that it changes from sin c ((sin x)/x) to flat.

Figure 3:
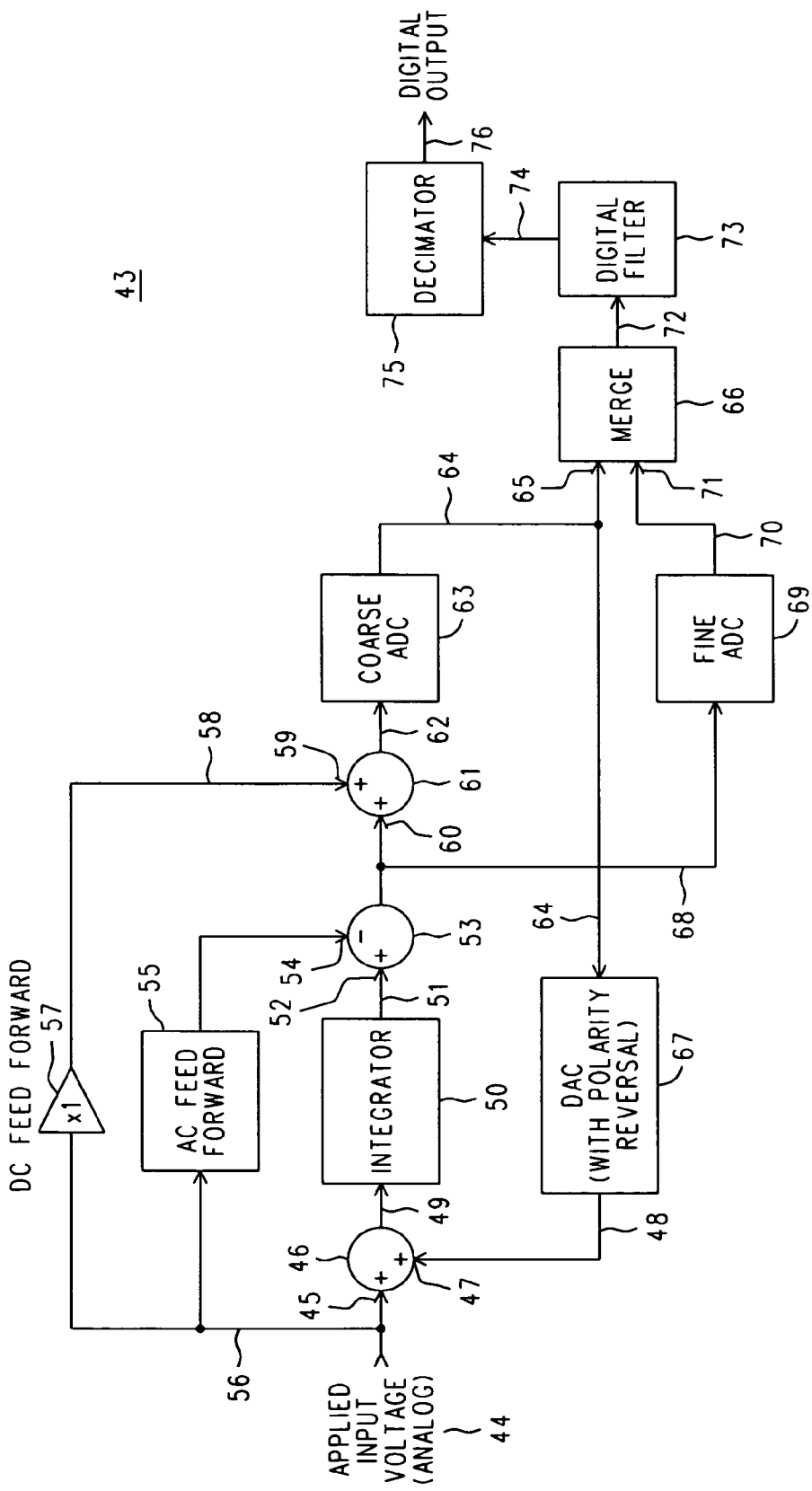
FIG. 3 is a simplified block diagram of an improved delta-sigma precision ADC that merges coarse and fine results.

Now refer to FIG. 3, wherein is shown a block diagram 43 of a delta-sigma architecture that takes the block diagram 20 of FIG. 2 as its starting place. If we ignore the AC feed forward mechanism (55) the operation of the feedback loop is essentially as described in connection with FIG. 2. Accordingly, an applied input voltage 44 to be measured is coupled to a first + (plus) input terminal 45 of a first voltage summing circuit 46. A feedback voltage 48 that approximates (but with opposite polarity) the applied input voltage (through the action of a coarse measurement to be described shortly) is applied to a second + (plus) input 47 of the first voltage summing circuit 46. A difference voltage that is also an error voltage 49 is produced by the first voltage summing circuit 46, and is used as the input to an integrator 50. The output 51 of the integrator 50 is coupled to a + input 52 of a voltage difference circuit 53 having a – input 54 that receives an AC feed forward voltage from circuit 55 (to be discussed in due course). The output voltage 68 from the voltage difference circuit 53 is sent two places. One place is a + input 60 of a second voltage summer circuit 61, whose other + input 59 is a DC feed forward voltage 58 from circuit 57. (This DC feed forward arrangement is essentially the same as described in connection with FIG. 2.) The other place voltage 68 is sent is the input to a fine ADC 69 that consists of a (fine) sample/hold circuit and a (fine) quantizer (these components might not appear separately, of course, as the ADC is preferably a merchant part in commerce that functionally appears to be a unitary object . . . ).

Now, the output 62 of the second voltage summer 61 is applied to a coarse ADC 63 that likewise consists of a (coarse) sample/hold circuit and a (coarse) quantizer (which is also preferably a merchant part that is most likely a single part combining both functions . . . ). As in the block diagram 20 of FIG. 2, the output 64 of the (coarse) ADC 63 is both used as a component in the production of the desired digital output (76), and also is fed back as the input to the feedback DAC 67 whose (polarity reversed) output 48 is applied to the input 47 of the first voltage summing circuit 46.

The outputs 64 and 70 from the coarse and fine ADCs (respectively) are applied to respective inputs 65 and 71 of a merge circuit (or merge function) 66 that combines the coarse and fine values to produce a precision (albeit as yet unfiltered, etc.) result (e.g., as a twelve-bit symbol in a space of 2$^{12}$ different symbols). The merged precision output 72 from the merge circuit is, as before, digitally filtered by digital filter 73, while the filtered output 74 is then decimated as appropriate by decimator 75 to produce a precision output 76. The filtering further extends the precision of the result. It will be appreciated that operations of the merge (66), digital filter (73) and decimator (75) could be performed in software executed by a controlling embedded system, or by special purpose hardware implemented with complex integrated circuits.

Some remarks are in order concerning the feedback DAC 67. It was noted at the beginning of the Specification that the incorporated CIRCUIT FOR GENERATING FROM LOW VOLTAGE EDGES HIGHER PULSES HAVING PRECISE AMPLITUDES AND DURATIONS describes some preferred aspects of an implementation for the feedback DAC 67. Among what is set out there is that a multi-bit binary value (the 'Digital' input to a DAC) expressed with low voltage logic levels is converted by the DAC 67 into a pulse with precision width and having a precision amplitude of either polarity and that is much higher than the voltage for the non-precision logic levels. The higher voltage values assist with obtaining good signal to noise ratio. The reader might have noticed that, whether precision or not, a pulse width is not, by itself, what is ordinarily meant as an 'Analog' output from a DAC. In this case, and in the context of a delta-sigma architecture, the appellation actually is apt, since the average value over time for a constant duty cycle pulse of constant amplitude corresponds exactly to a unique and steady analog DC voltage, and the integrator (9, 27, 50) truly does provide that average over time (even though it is first operated upon to form a voltage difference with the applied input voltage). It will be appreciated that, since an integrator is responsive to both the width and amplitude of a series of pulses from the pulse-width style DAC, and the since the linearity of a delta-sigma converter is determined essentially by that of the feedback DAC, it behooves us to select such a DAC circuit that does produce both precision width and precision amplitude. In this context, precision width means a precision duty cycle for pulses occurring at a fixed clock rate, and precision amplitude means more that every pulse has the same rise time and amplitude as every other pulse, more than having any particular rise time or particular amplitude. Given those considerations, coupled with an integrator that doesn't leak or drift, etc, we can impute similar precision to the integrator output. We shall have more to say below about the virtues of the architecture of the block diagram 43 in FIG. 3.

The DAC may use a "return-to-zero" or a "non-return-to-zero" waveform for the pulse-width system. For return-to-zero, the pulse width modulation uses two edges during every decision cycle. For non-return-to-zero, the pulse width modulation uses just one edge per decision cycle. For a given pulse-width settling time, the non-return-to-zero system is more efficient but the output filtering must reject a tone at half the decision rate.

Now, having described how everything is all connected as is seen in FIG. 3, we proceed with an explanation of why this architecture is capable of precision operation. Let us suppose that for some relatively long time there has been a steady state (DC) input applied as input voltage 44, so that the loop has stabilized. Let's observe it in this state, and see what we can learn. Since the input has been static for a while, the output of the AC feed forward circuit 55 is either static or zero, so that summer 53 does not affect the integrator output 51, and we can (for now) ignore the AC feed forward function. The DC feed forward circuit 57, however, will produce an output that closely approximates the applied input voltage 44. We may think of the DC feed forward circuit 57 as stable low drift amplifier of unity gain. The gain need not be exactly unity (an error here is an error that can be calibrated out). Whatever its actual gain is, the effective gain of the DC feed forward circuit 57 should be the same for inputs of all legal levels. The other virtues of high stability, linearity and low drift between calibration cycles are much less important, as these are performance issues that, just as for ADC linearity, are 'automatically' nulled out by corresponding 'custom created' hunting arising from the feedback operation of the converter's feedback loop.

The effect of the DC feed forward voltage 58 is to remove the need for the integrator to change significantly over the two or three loop decision cycles otherwise needed to eventually cause the coarse ADC 63 to approximate the applied input voltage 44 (such 'changing significantly' producing an ever smaller error signal 49 that eventually would end an overall ramp behavior which is then replaced by hunting, as previously described). In a nutshell, since the applied input voltage supplies (via the DC feed forward circuit 57) its own replica, large excursion ramping by the integrator is not needed, and it commences to hunt without such ramping. (That is, the DC feed forward causes the coarse ADC/DAC combination to very quickly produce a feedback voltage 48 that limits the size of the error voltage 49.) This might mean that the design of the integrator can be less stringent than otherwise, as the usual integrator output while hunting represents a small fraction of the applied input voltage 44. On the other hand, other considerations (e.g., faster overload recovery) may continue to benefit from an integrator that does retain the full dynamic range associated with the arrangement shown in FIG. 1. In any event, the integrator output represents the error between the applied input voltage 44 and the output 64 of the coarse ADC 63. Both the integrator output and the output of the coarse ADC will exhibit the 'hunting behavior' and need to be properly understood over time to 'know what they are.' Aside from the hunting behavior (which is ubiquitous), the effect of the DC feed forward mechanism is to allow the integrator's output to be quasi-independent of the applied input, say, in the range of five or ten percent of what would otherwise be full scale.

Now, let's dwell here for a moment. The coarse ADC performs a low resolution approximation that is accurate as far as it goes. If it were to be used by itself, then subsequent averaging would improve its resolution. There is a limit to averaging, however, as heavier filtering will reduce the bandwidth for tracking an AC input. If still more resolution were desired, then one way to get it would be to use for 63 a more capable ADC. This can become an expensive solution, since it has to operate at least as fast as the loop decision rate. There is another way.

We have stressed that the nature of the delta-sigma converter's operation is such that exact convergence almost never occurs; the hunting that ensues is part of the 'result' that must be taken into account through averaging the values of the sequence of symbols created by the ADC. It will be appreciated that for the single ADC (as in FIG. 2), or for just the coarse ADC 63 (as in FIG. 3), the hunting is visible only after, and as a direct result of, the quantizing performed by that ADC. Because of the finite nature of any practical quantization, we would in principle have to average an indefinitely long string of symbols to extract maximum precision represented by the string.

Now note that the error signal 68 is just the hunting component of the loop's operation, and that it is not quantized! That is, it is (after some delay) the (actual) input minus the (quantized) measured coarse value. If we take a given quantized coarse symbol and associate it with the correct instance of the error signal 68, we have a 'complete' description of what the delta-sigma loop thinks the input is. If we can combine the two (as a coarse and a fine measurement) we would no longer need to average an indefinitely long string of symbols to remove the effects of the hunting and extract all the information that the sequence contains. As it turns out, we can obtain the error as a fine measurement and combine it with the coarse one. Both will, however, will still be of finite resolution, and averaging of the combined coarse/fine symbols remains a useful tool to suppress the remaining (and unquantized) vestiges of the hunting and reveal more precision that is still 'buried' in the sequence of symbols.

For this strategy to be successful, the subtraction (performed by 46) must produce a precision difference, and we will rely not just on the presence of the (optional) DC feed forward, but principally on the DAC 67 to not corrupt the 'computation,' which is why we go to the trouble of using a precision DAC, such as the one described in the incorporated '241 patent. So, with a precision DAC (67) in hand, we use it to subtract out from the input the amount the coarse ADC 63 identifies (with the help of the DC feed forward) as being part of the applied input voltage 44. That difference (49) is applied to the integrator 50, whose output 51 is a linear function of that difference 49. (The integrator has a fixed rate of integration, so for fixed loop decision intervals its equivalent operation is to multiply the input by some constant and add that to the previous accumulation.) Because of the DC feed forward voltage 58, the error voltage 49 is only the long term 'I can't quantize it exactly and have to hunt' error associated with the coarse ADC 63. It is important to remember that the 'instantaneous' output of the coarse ADC at any one time is an incomplete result, and that it is its behavior over time (which includes the hunting component) that is of interest. The changing nature (hunting) of that behavior is, of course, produced by the integrated error voltage.

As previously mentioned, one way to obtain the information contained in the integrated error voltage is to simply process the hunting behavior as measured by a very high performance ('coarse') ADC. As mentioned above, another (and superior) way is to separately measure the isolated hunting related error voltage with the fine ADC 69. This latter way is superior to the former, as the dynamic range of the coarse ADC must be matched to the entire allowable excursion of the applied input voltage. Thus, the available resolution (say, eight bits) of the coarse ADC is mapped into a large voltage swing. The fine ADC (which might have ten bits of resolution) is exposed to only the much smaller excursions of the integrated error signal 51 (again, we are ignoring the behavior of the AC feed forward circuit 55, although it does not negate this observation). The output of the fine ADC 69 produces a digital version of the hunting, just as does the coarse ADC, save that it is at a considerably higher resolution and that it does not reflect (is unaware of) any particular amount 'subtracted out' by the DC feed forward mechanism. We arrange that the least significant bits of the coarse ADC output 64 overlap the precision of the most significant bits from the fine ADC's output 70, so that they can be properly concatenated by a merge mechanism 66, one of whose inputs 65 receives the coarse ADC output 64 and another one of whose inputs 71 receives the fine ADC output 70. After the merging, the concatenated results can be processed and otherwise averaged as if there were simply one really good (think: expensive!) high precision ADC (used after the fashion of FIG. 2).

It is appropriate to dwell on the nature of the merge mechanism 66. Recall our discussion of how the bits from ADC of FIGS. 1 and 2 are best construed as symbols in a value space, and that the filter averages a consecutive sequence of symbols. The idea of the coarse and fine ADCs of FIG. 3 is that each ADC similarly produces symbols in their own respective value space, and that if we understand correctly the relationship between those two spaces, we can combine the members of a corresponding pair of coarse and fine symbols to obtain another (precision) symbol that belongs to a value space that has greater resolution. Thus, we take a stream eight-bit of coarse symbols and its associated (through simultaneity) stream of ten-bit fine symbols, combine the pairs, and create a sequence of, say, sixteen bit precision symbols that can then be averaged by the filter to obtain even greater resolution.

Here is a more detailed description of the merge operation. It consists of a unit delay (a loop decision cycle) for the (coarse) feedback measurement, a filter arrangement for the measured fine value that subtracts the newest value from the previous value, a gain element to calibrate the scale of the fine measurement to that of the coarse (which may be ahead of and outside the merge circuit proper, and which might be applied to either one or both of the digitized coarse and fine values), and a summation of the filtered and scaled fine value to the delayed coarse value. If the gain calibration were ideal, this operation would nearly completely remove the quantization error associated with the coarse ADC and DAC aspects of the loop's operation. (It is only nearly so, since the quantization of the fine value is finite, leaving some information still embedded in the sequence of symbols created by the hunting. Hence, averaging is still in order.) It will be appreciated that measurement noise is thus improved by approximately the ratio of coarse ADC and feedback DAC quantization noise to fine ADC quantization noise. The merge operation does not affect linearity because a subtraction in the merge filter rejects any low frequency distortion introduced by the fine ADC.

Now consider the AC feed forward mechanism 55. We begin by describing why we need it, followed by an explanation of how it does what it needs to do. To begin the discussion of why the AC feed forward is needed, let us suppose that the integrator 50 were of the switched capacitor variety, instead of the continuous time type (i.e., instead of a continuously adjustable constant current source charging/discharging a fixed capacitor). A switched capacitor integrator operates as a sampling circuit whose captured sampled value drives an integrator. Subsequent to each sample time it performs its operation on the voltage captured at the instant of sampling, and is not affected by whatever behavior the 'real' input voltage might exhibit between sample times. It is, in fact, a quantized-to-discrete-times arrangement, and actually comports quite nicely with the quantized nature of the rest of the delta-sigma loop architecture. So much so that, in principle, anyway, it does not exhibit the behavior that needs correction by the AC feed forward mechanism. (So why don't we prefer to use a switched capacitor integrator? The practical circuits available have other limitations, such as finite switching times and different behaviors for large and small signals, that ruin the precision of the measurement, which causes us to prefer to avoid the sample and hold circuit and use instead a genuine continuous time integrator that is always exposed to the input signal.) That is, in principle, an ideal switched capacitor integrator would produce an output that is a function of only the conditions at the time of sampling (which is also when the rest of the system decides things). The ill-effects of any moving signals are held at bay by enforcing the Nyquist sampling criteria, which also applies to the system as a whole. Upon reflection the reader will appreciate the behavior of an IDEAL switched capacitor integrator is 'error free' as far as what is required of it for use in the (sampled) delta-sigma loops of FIGS. 1–2. To achieve comparable behavior with a continuous time (real) integrator one would have to quantize the applied input signal and allow it to change in a step-wise fashion only at the decision times used by the rest of the delta-sigma loop. If this were done, then there would be no way to tell the difference between the two techniques of integration, and the AC feed forward mechanism would again be unnecessary.

We have now snuck up upon what it is that goes wrong when a continuous time integrator is used and the applied input voltage is allowed to vary with time. Let us say that the applied input voltage 44 has an AC component that is sinusoidal with a significant peak to peak voltage and a period that is long compared to the decision rate of the loop. As a convenient (but contrived, as in general the properties of the AC component are arbitrary) example let's assume that the sinusoidal component has a zero crossing at a decision time, $T_0$. The integrator will integrate over the interval of $T_0$ to $T_1$ (one decision time cycle), and to describe its behavior during that interval we could begin by noting what its output is at a series of equally spaced intermediate points, say one hundred of them ($T_{0.01}$–$T_{1.00}$). According to our premise, at $T_{0.00}$ we begin integrating with whatever the DC component is and an instantaneous AC component value of zero. But at $T_{0.01}$ the AC component value is no longer zero, so the integrator is integrating a different input value. And still a different one at $T_{0.02}$, etc. In this discrete example the integrator output is a summation (a discrete $\Sigma$ and not a continuous $\int$) of the behavior of the input at the one hundred approximating points. That behavior includes a dv/dt that is our AC component, so there is a $\Sigma$dv/dt included in the integrator output, in addition to the integration of the DC component. Of course, this stepwise analysis is just an explanatory tool, and the real situation is reached by passing to the limit. Now note that if the frequency of the AC component is low so that its period is long compared to the loop's decision cycle time, the values added by the $\Sigma$dv/dt noted above are 'small.' But that changes as the period of the AC component becomes shorter.

As the frequency of the AC component approaches half the decision rate, the $\Sigma$dv/dt can begin to approach sixty-three percent the peak to peak excursion of that AC component. So, the output of a continuous time integrator is influenced by an AC component of the applied input voltage 44, according to both the frequency and the amplitude of that AC component. It can now be appreciated that it is precisely because a switched capacitor integration mechanism samples and then ignores changes between samples, that it is immune to this effect. (One might object that even when restricted to official sample times, the presence of the AC component shows up as periodic disturbance to the value of the DC component. True, but under the framework of the example that effect would average to zero over a sufficiently long sequence of decisions. But then you say: "What about actual AC measurements? What's the point of a one microsecond decision time if you can't measure, say, an audio frequency AC voltage? Our reply is that, by these rules the DC plays the role of that audio signal, and that we can indeed produce a very accurate digitized version of that AC input waveform, using the same basic filtering and decimation we would use for DC. But since it is AC, those digitized values will need to be understood as a sequence of digitized samples, and that if a Root Mean Squared or a Peak to Peak value is sought, then additional suitable processing of the sequence of digitized samples will be needed.)

Now, back to the reason for the AC feed forward mechanism. It can now be appreciated that if the decision rate of the delta-sigma loop is taken as a sampling rate, then for AC signals that allow that sampling rate to meet Nyquist requirements, the output of a continuous time integrator includes an error that increases with the frequency of the AC signal, as scaled by the amplitude of the AC signal. This error corresponds to a deviation from unity for the ADC transfer function, and it undesirable in many delta-sigma applications. A particular disadvantage of allowing this error to remain at large in the present application is that it increases the expected signal swing with which the fine ADC must contend. For a given number of bits provided by the fine ADC, that increased signal swing translates into a loss of resolution.

The AC feed forward mechanism is designed to approximately remove the effect of continuous integration so that the resulting system operates like the discrete time equivalent over the input band of interest. It is possible to show that the difference between continuous and discrete integration produces an additive error term in the output signal of the integrator that is proportional to the magnitude of $$H_1(W) = e^{(-j*W/2)} * (\sin c(W/2) - e^{(-j*W/2)})$$

where W=2πfT, with f as the input frequency and T as the decision rate.

One way to cancel this additive term is to subtract an appropriately filtered version of the input waveform from the integrator output. One property of the feedback loop is that any signal inserted after the integrator will be filtered by $H_2(W)=(1-e^{(-j*W)})$. This is the quantization noise shaping function. Therefore, any injected signal must be filtered by approximately $H_1(W)/H_2(W)$ over the band of interest. A nearly ideal filter is a delay of 0.19 times the decision period, with a gain that varies between 0.50 at DC and 0.59 at half the decision period. Since actual delay circuits are often hard to realize, we are led to consider approximations. One simple circuit that roughly matches this goal is a gain stage followed by a single pole, and this is what would be used for the AC feed forward mechanism 55 of FIG. 3. It will be appreciated that there may well be other such useful approximations.

Another way to cancel this term is to subtract a somewhat differently filtered version of the input from the integrator input. When injecting the signal before the integrator, the filtering must also account for the integration. There is an equivalent circuit to the gain and pole compensation described above that uses a gain and a series RC before the integrator. This alternative removes the need for a subtraction circuit, and will be shown in connection with the following description of FIG. 4.

Figure 4:
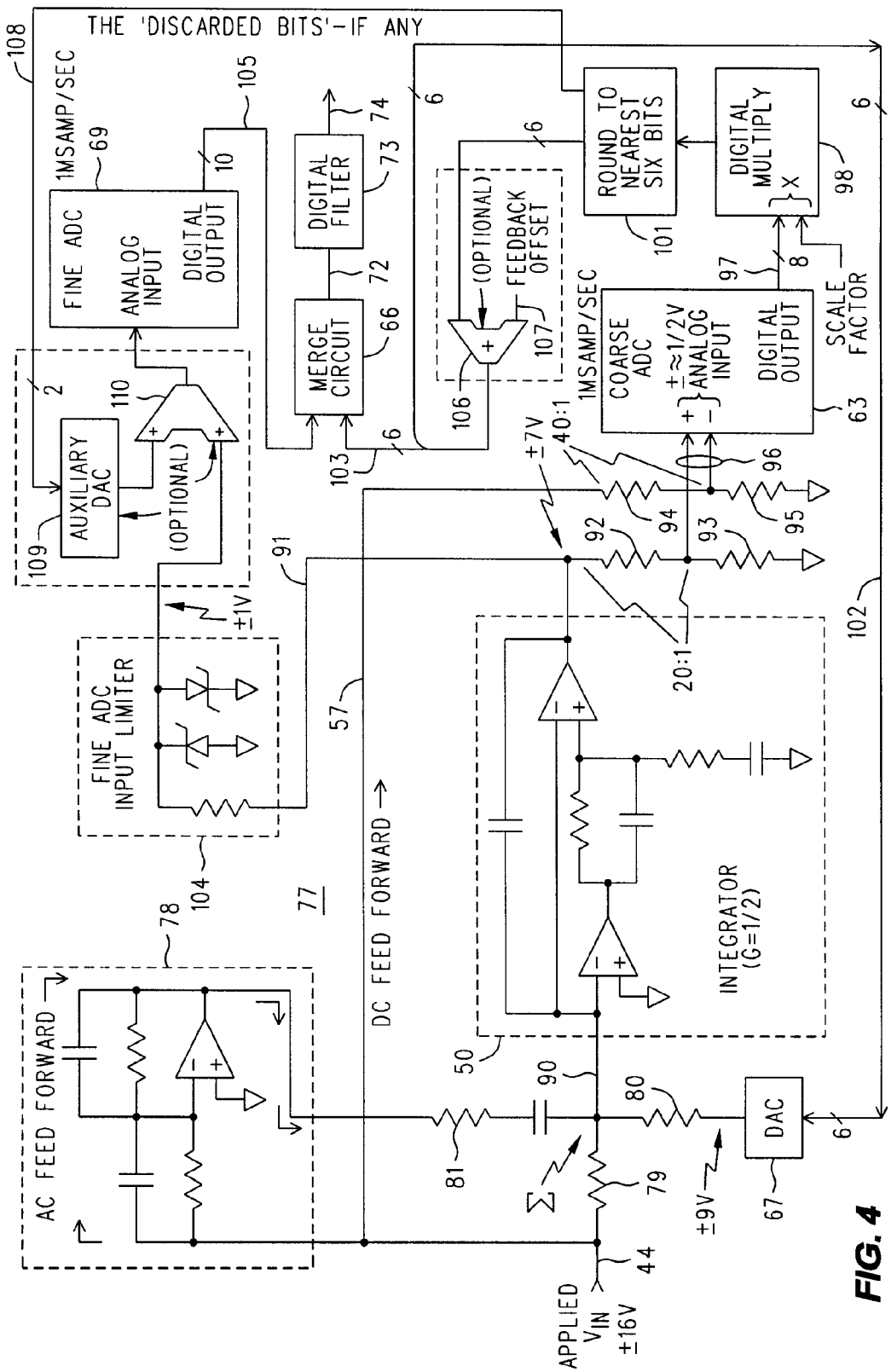
FIG. 4 is a simplified block diagram representing a specific preferred implementation of the block diagram of FIG. 3.

Referring now to the somewhat more detailed block diagram of FIG. 4, an applied input voltage $V_{IN}$ to be measured is coupled to an input terminal 44. In one preferred embodiment $V_{IN}$ may exhibit a range of values that is ±16V (DC or P—P). That input is applied through resistor 79 to a summing junction 90, whose other inputs are through resistor 80 (for the polarity inverting feedback DAC 67) and through resistor 81 (for the AC feed forward signal from circuit 78). The summing junction 90 is also the input to a continuous time integrator 50, whose general nature is shown, and which is also conventional. In this particular embodiment the gain of the integrator is one half, and its output 91 can exhibit a ±7V excursion when the loop experiences a transient input.

The output 91 of the integrator 50 is coupled to two places. The first is through a 20:1 voltage divider (92, 93) to a plus (+) portion of a differential input of a coarse ADC 63. The minus (−) portion of the differential input is fed from a 40:1 voltage divider (94, 95) that is driven by the DC feed forward signal 57, which is also the $V_{IN}$ applied to terminal 44. The coarse ADC 63 thus sees about ±½ V as its analog input, and operates at one mega-sample per second to produce an eight-bit output 97. Coarse ADC 63 may be an AD9283 from Analog Devices, Inc.

The second place the output 91 of the integrator 50 is coupled is to the fine ADC 69, via an input limiter circuit 104. The input limiter circuit 104 protects the fine ADC 69 from large transients, as the nominal 'balanced loop' hunting voltage excursions it is expected to digitize are in the range of ±1V. The fine ADC 69 operates at the same sample rate as, and in synchrony with, the coarse ADC 63; it produces a ten-bit output 105. Fine ADC 69 may be an AD9200 from Analog Devices, Inc.

The eight-bit output 97 from the coarse ADC 63 is coupled to a digital multiply circuit 98, where it is scaled to compensate for various circuit gains, after which it is rounded to the nearest six bits (101). The result of that is a six-bit feedback value 102 that is sent to the polarity inverting feedback DAC 67 and (as 103) to the merge circuit 66. The merge circuit 66 receives inputs 103 and 105, and operates as previously described. Its output 72 is applied to a digital filter 73 whose output 74 is, after suitable decimation (not shown), a variable speed/resolution precision digital value representing the applied $V_{IN}$.

Note the AC feed forward circuit 78. It is fed by $V_{IN}$ and produces an output that is added to the input of the integrator 50, as opposed to the arrangement shown in FIG. 3 where it is applied to the integrator output as a signal to be removed.

Here are some final observations concerning the operation of the delta-sigma architectures shown in FIGS. 3 and 4.

Each of the coarse ADC and the fine ADC has an associated specific input range, a maximum sample rate, and a minimum sample latency, which influence the overall ADC design in ways briefly discussed below. The input range is usually expressed as a symmetric signal swing (input range) about a bias point. (Both the input range and the bias point are often related to a reference voltage that may, in principle, be either internal or external to the coarse and fine ADCs. In our case, 'things track the DAC' 67 independently of any local references in the ADCs 63 and 69, and the overall 'reference voltage' is essentially the precision pulse width modulation performed by the DAC 67.)

For the coarse ADC, the gains applied to the DC feed forward and to the integrator output ensure that the input swing into the coarse ADC is acceptable. The input swing may be centered around the bias point using a variety of biasing circuits, including a simple resistive divider.

Since the coarse ADC is inside a feedback loop, the sample latency partially determines the duration between the end of one pulse width modulation cycle of the DAC and the beginning of another. Therefore, the coarse ADC sample latency must be a fraction of the overall delta-sigma converter's decision rate. Conceptually, the coarse and fine ADC are sampled once at the beginning of each decision cycle. Because of sample latency and feedback processing delay, it may be advantageous to sample the coarse ADC before the start of each decision cycle. This early sampling introduces an error related to integrating the input and feedback signals for less than an entire integration period when the coarse ADC takes a sample. The effect of this error may be (optionally) reduced by adding a feedback offset 107 to each feedback sample 103 with an adder 106. The value of the feedback offset 107 can be chosen to compensate for the integration of the feedback between the actual sample point and the beginning of the decision cycle.

For the fine ADC, the integrator gain ensures acceptable input swing into the fine ADC. The fine ADC may be biased using standard circuits. Alternatively, the integrator output may be shifted to center around the fine ADC bias point by adding a fixed offset to each coarse ADC sample as part of feedback offset 107.

Since the fine ADC is not inside a feedback loop, the sample rate need only match the converter decision rate, and the sample latency is not constrained. The fine ADC sample timing may be adjusted from the beginning of the decision cycle to allow for more analog settling of the feedback DAC 67 and more precise cancellation of the effects of early coarse ADC sampling.

The overall delta-sigma ADC has two quantities that should be calibrated: feedback gain and fine merge gain. The feedback gain is used to scale the coarse ADC sample into the feedback value. This scaling is calibrated to account for component deviations in the integrator gain, DC feed forward gain, feedback reference, and coarse ADC reference.

One possible criterion for this calibration is to minimize the integrator output change that corresponds to input level shifts. Ideally, there is no correspondence, but component deviations may cause some dependence. Reducing this dependence improves the utilization of the fine ADC range and reduces possible non-linearities related to the integrator. This calibration is performed by applying a positive and a negative voltage to the ADC and measuring the average integrator output level using just the fine ADC. This is done repeatedly with different feedback gains until the difference in the amount of integrator shift between the positive and negative input level is minimized.

Another possible calibration criterion is to minimize the Infinite Impulse Response of the feedback loop. This improves the step response and does not require an external voltage source. This calibration is performed by digitally injecting either a periodic impulse or a specific tone into the feedback loop. The feedback gain is adjusted until the impulse response is minimized or the phase shift of the tone matches the ideal value.

The fine merge gain is used to combine the feedback and fine samples into an output sample. The fine merge gain scales the fine sample to match the feedback sample. The value varies due to component and reference tolerances. This calibration is common in cascaded delta-sigma systems. One method of calibration is to digitally inject a known sequence into the feedback loop and measure the correlation between the fine ADC samples and the injected sequence. Another method is to apply zero to the ADC and find the merge gain that minimizes the standard deviation of the output samples.

In many delta-sigma designs, dither is used to improve performance. Adding a digital dither into the feedback loop reduces some error mechanisms in this design. Dither may be added as part of feedback offset 107.

The range of the fine ADC 69 is determined in part by the combination of the resolution of the coarse ADC 63 and that of the DAC 67. If the resolution of DAC 67 is less than the coarse ADC's resolution, some portion (e.g., two least significant bits 108) of the coarse ADC resolution may simply be discarded by the rounding (101) performed in FIG. 4, provided the range of the fine ADC can handle the entire error signal from the integrator that results from the 'now coarser' resolution provided by DAC 67. We say 'now coarser' in this sense: if we assume (as we are doing for the sake for example) that there are eight bits of resolution in the coarse ADC 63 and only six for DAC 67, then we are ignoring two least significant bits (108), and the 'now coarser' DAC resolution is six bits as opposed to 'a finer' eight bits of resolution. Unfortunately, eight bits of resolution is asking a lot (!) from DAC 67, so we might well simply use the six bits of resolution. That translates to about four times the size for the integrated error signal 91 that is applied to the fine ADC, as compared to an eight-bit case, but in an actual embodiment was found to be a quite viable solution.

As an alternative to simply discarding the example two least significant bits (108), the range of the fine ADC may be reduced to encompass just the (original eight-bit) coarse ADC resolution by using an auxiliary DAC 109 to offset the fine ADC. The output levels of the auxiliary DAC 109 are determined by the additional coarse ADC resolution, which in turn corresponds to a known error that will be placed on the integrator during the next decision cycle because of the rounding (101). The auxiliary DAC 109 may have just a few levels (corresponding to the difference in the number of bits between the coarse ADC and the feedback DAC) and has limited accuracy requirements. The output of auxiliary DAC 109 is summed with the output of input limiter 104 by summer 110, and the result is applied as the input to the fine ADC 69.

It will, of course, be appreciated that, although we have shown the optional 106/107 adder and the optional auxiliary DAC 109 and its summer 110 in an embodiment with an AC feed forward arrangement that drives the input of the integrator, these optional circuits may be employed with the AC feed forward arrangement of FIG. 3, as well. Likewise, the optional 106/107 adder and the optional auxiliary DAC 109 and its summer 110 represent two separate and distinct activities that may be practiced independently: either one or both may be used, as desired.

We claim:

1. A method of converting an applied analog input signal to a digital representation thereof, the method comprising the steps of:
   (a) converting a previous instance of a coarse digital approximation of the applied analog input signal to an analog feedback signal;
   (b) forming the analog difference between the analog feedback signal and the applied analog input signal;
   (c) integrating the analog difference found in step (b);
   (d) generating a DC feed forward voltage from the applied analog input signal;
   (e) adjusting the integrated analog difference produced in step (c) with the DC feed forward voltage generated in step (d) to produce a coarse composite signal;
   (f) converting the coarse composite signal to a next instance of the coarse digital approximation of the applied analog input voltage, whereby each next instance of the coarse digital approximation is available for use in a respective new instance of step (a) as the recited previous instance of a coarse approximation of the applied analog input signal; and
   (g) for each instance of step (f), converting the integrated analog difference of step (c) to a next instance of a fine digital value that represents increased resolution for the coarse digital approximation of step (f).

2. A method as in claim 1 further comprising the step (h) of merging corresponding instances of the coarse digital approximation and the fine digital value into a unified digital value representing the value of the applied analog input signal.

3. A method as in claim 2 further comprising the step (i) of digitally processing a sequence of unified digital values.

4. A method as in claim 1 wherein the previous instance of a coarse digital approximation used in step (a) is digitally complemented to have the opposite polarity of that of the applied input signal and wherein the converting of step (a) comprises pulse width modulation with a signal of that opposite polarity, and further wherein step (b) comprises analog addition.

5. A method as in claim 1 wherein the previous instance of a coarse digital approximation used in step (a) has the same polarity as that of the applied input signal and wherein the converting of step (a) comprises pulse width modulation with a signal of that same polarity, and further wherein step (b) comprises analog subtraction.

6. A method of converting an applied analog input signal to a digital representation thereof, the method comprising the steps of:
   (a) converting a previous instance of a coarse digital approximation of the applied analog input signal to an analog feedback signal;
   (b) forming the analog difference between the analog feedback signal and the applied analog input signal;
   (c) integrating the analog difference found in step (b);
   (d) generating an AC feed forward signal from the applied analog input signal;
   (e) adjusting the integrated analog difference produced in step (c) by the AC feed forward signal generated in step (d) to produce an adjusted integrated error signal;
   (f) generating a DC feed forward voltage from the applied analog input signal;

(g) combining the adjusted integrated error signal of step (e) with the DC feed forward voltage generated in step (f) to produce a coarse composite signal; and (h) converting the coarse composite signal to a next instance of the coarse digital approximation of the applied analog input voltage, whereby each next instance of the coarse digital approximation is available for use in a respective new instance of step (a) as the recited previous instance of a coarse approximation of the applied analog input signal.

7. A method as in claim 6 further comprising the step (i) of, for each instance of step (h), converting the adjusted integrated error signal of step (e) to a next instance of a fine digital value that represents increased resolution for the coarse digital approximation of step (h).

8. A method as in claim 7 further comprising the step (j) of merging corresponding instances of the coarse digital approximation and the fine digital value into a unified digital value representing the value of the applied analog input signal.

9. A method as in claim 8 further comprising the step (k) of digitally processing a sequence of unified digital values.

10. A method as in claim 6 wherein the previous instance of a coarse digital approximation used in step (a) is digitally complemented to have the opposite polarity of that of the applied input signal and wherein the converting of step (a) comprises pulse width modulation with a signal of that opposite polarity, and further wherein step (b) comprises analog addition.

11. A method as in claim 6 wherein the previous instance of a coarse digital approximation used in step (a) has the same polarity as that of the applied input signal and wherein the converting of step (a) comprises pulse width modulation with a signal of that same polarity, and further wherein step (b) comprises analog subtraction.

12. A method of converting an applied analog input signal to a digital representation thereof, the method comprising the steps of:

(a) converting a previous instance of a coarse digital approximation of the applied analog input signal to an analog feedback signal;

(b) forming the analog difference between the analog feedback signal and the applied analog input signal;

(c) generating an AC feed forward signal from the applied analog input signal;

(d) adjusting the analog difference formed in step (b) by the AC feed forward signal generated in step (c) to produce an adjusted analog difference;

(e) integrating the adjusted analog difference of step (d) to produce an adjusted integrated error signal;

(f) generating a DC feed forward signal from the applied analog input signal;

(g) combining the adjusted integrated error signal of step (e) with the DC feed forward signal generated in step (f) to produce a coarse composite signal; and (h) converting the coarse composite signal to a next instance of the coarse digital approximation of the applied analog input voltage, whereby each next instance of the coarse digital approximation is available for use in a respective new instance of step (a) as the recited previous instance of a coarse approximation of the applied analog input signal.

13. A method as in claim 12 further comprising the step (i) of, for each instance of step (h), converting the adjusted integrated error signal of step (e) to a next instance of a fine digital value that represents increased resolution for the coarse digital approximation of step (h).

14. A method as in claim 13 further comprising the step (j) of merging corresponding instances of the coarse digital approximation and the fine digital value into a unified digital value representing the value of the applied analog input signal.

15. A method as in claim 14 further comprising the step (k) of digitally processing a sequence of unified digital values.

16. A method as in claim 12 wherein the previous instance of a coarse digital approximation used in step (a) is digitally complemented to have the opposite polarity of that of the applied input signal and wherein the converting of step (a) comprises pulse width modulation with a signal of that opposite polarity, and further wherein step (b) comprises analog addition.

17. A method as in claim 12 wherein the previous instance of a coarse digital approximation used in step (a) has the same polarity as that of the applied input signal and wherein the converting of step (a) comprises pulse width modulation with a signal of that same polarity, and further wherein step (b) comprises analog subtraction.

18. A method of converting an applied analog input signal to a digital representation thereof, the method comprising the steps of:

(a) converting, with a first resolution, a previous instance of a coarse digital approximation of the applied analog input signal to an analog feedback signal;

(b) forming the analog difference between the analog feedback signal and the applied analog input signal;

(c) integrating the analog difference found in step (b);

(d) generating a DC feed forward voltage from the applied analog input signal;

(e) adjusting the integrated analog difference produced in step (c) with the DC feed forward voltage generated in step (d) to produce a coarse composite signal;

(f) converting, with a second resolution greater than the first resolution, the coarse composite signal of step (e) to a next instance of the coarse digital approximation of the applied analog input voltage, whereby each next instance of the coarse digital approximation is available for use in a respective new instance of step (a) as the recited previous instance of a coarse approximation of the applied analog input signal;

(g) for each instance of step (f), converting into an auxiliary analog voltage the least significant portion of the coarse digital approximation of step (f) that corresponds to the amount by which the second resolution exceeds the first resolution;

(h) for each instance of step (g), summing the auxiliary analog voltage with the integrated analog difference of step (c); and (i) for each instance of steps (h) and (f), converting the sum found in step (h) to a next instance of a fine digital value that represents increased resolution for the coarse digital approximation of step (f).

19. A method as in claim 18 further comprising the step (j) of adjusting the integrated analog difference of step (c) according to a selected AC transfer function performed upon the applied input signal.

20. A method as in claim 18 further comprising the step (j) of adjusting the analog difference formed in step (b) according to a selected AC transfer function performed upon the applied input signal.

* * * * *